United States Patent
Muhammad

(10) Patent No.: US 8,553,802 B2
(45) Date of Patent: Oct. 8, 2013

(54) QUADRATURE COMMUNICATIONS DEVICE WITH I ANTENNAS AND Q ANTENNAS AND MODULATED POWER SUPPLY AND RELATED METHODS

(75) Inventor: Khurram Muhammad, Irving, TX (US)

(73) Assignee: Blackberry Limited, Waterloo, Ontario (CA)

( * ) Notice: Subject to any disclaimer, the term of this patent is extended or adjusted under 35 U.S.C. 154(b) by 233 days.

(21) Appl. No.: 13/049,200

(22) Filed: Mar. 16, 2011

(65) Prior Publication Data

US 2012/0236959 A1 Sep. 20, 2012

(51) Int. Cl.
H04L 27/00 (2006.01)

(52) U.S. Cl.
USPC ........... 375/295; 375/268; 375/259; 375/296; 375/297; 375/300; 375/309; 375/312; 330/10; 330/149; 330/51; 330/124; 455/127.3; 455/127.4; 455/127.5; 455/114.3; 455/108; 455/296; 455/297

(58) Field of Classification Search
USPC ................ 375/268, 259, 295, 296, 297, 300, 375/309, 312; 330/10, 149, 51, 124; 455/127.3, 127.4, 127.5, 114.3, 108, 296, 455/297
See application file for complete search history.

(56) References Cited

U.S. PATENT DOCUMENTS

| | | | |
|---|---|---|---|
| 5,559,788 A | 9/1996 | Zscheile, Jr. et al. ........... 370/18 |
| 5,847,602 A * | 12/1998 | Su .................................. 330/10 |
| 6,084,548 A * | 7/2000 | Hirabe .................. 343/700 MS |
| 6,181,199 B1 * | 1/2001 | Camp et al. ...................... 330/10 |
| 7,221,915 B2 * | 5/2007 | Tripp et al. ................. 455/127.3 |
| 7,447,272 B2 * | 11/2008 | Haglan ......................... 375/295 |
| 7,532,679 B2 | 5/2009 | Staszewski et al. ........... 375/295 |
| 8,292,175 B2 * | 10/2012 | Kim ................................ 235/439 |
| 8,300,728 B1 * | 10/2012 | Hoffmann et al. ............. 375/302 |
| 2005/0226340 A1 * | 10/2005 | Ahmed .......................... 375/259 |
| 2008/0205571 A1 | 8/2008 | Muhammad et al. .......... 375/376 |
| 2008/0219385 A1 | 9/2008 | Feher ............................ 375/340 |
| 2008/0220733 A1 | 9/2008 | McCune ...................... 455/118 |
| 2009/0258612 A1 | 10/2009 | Zhuang et al. ................ 455/110 |

(Continued)

FOREIGN PATENT DOCUMENTS

| | | |
|---|---|---|
| EP | 2222044 | 8/2010 |
| WO | WO 2008/082867 | 7/2008 |
| WO | 2008/150147 | 12/2008 |

OTHER PUBLICATIONS

Kim, Nam Yun, PCT/KR2008/003209, published on Dec. 11, 2008.*

*Primary Examiner* — Siu Lee
(74) *Attorney, Agent, or Firm* — Allen, Dyer, Doppelt, Milbrath & Gilchrist, P.A.

(57) ABSTRACT

A communications device may include an In-phase (I) power amplifier configured to generate an I amplified signal, a Quadrature (Q) power amplifier configured to generate a Q amplified signal, an I digital-to-analog converter (DAC) configured to generate an I signal, and a Q DAC configured to generate a Q signal. The communications device may also include an I power supply circuit coupled to the I power amplifier and to the I DAC and configured to cause the I power amplifier to modulate an I carrier signal into the I amplified signal based upon the I signal, a Q power supply circuit coupled to the Q power amplifier and to the Q DAC and configured to cause the Q power amplifier to modulate a Q carrier signal into the Q amplified signal based upon the Q signal, and at least one antenna coupled to the I and Q power amplifiers.

25 Claims, 13 Drawing Sheets

(56) References Cited

U.S. PATENT DOCUMENTS

| | | | |
|---|---|---|---|
| 2009/0280742 A1 * | 11/2009 | Schantz et al. | 455/41.1 |
| 2010/0016032 A1 | 1/2010 | Zhu et al. | 455/572 |
| 2010/0208848 A1 | 8/2010 | Zhu et al. | 375/340 |

* cited by examiner

US 8,553,802 B2

QUADRATURE COMMUNICATIONS DEVICE WITH I ANTENNAS AND Q ANTENNAS AND MODULATED POWER SUPPLY AND RELATED METHODS

TECHNICAL FIELD

This application relates to the field of communications, and more particularly, to wireless communications systems and related methods.

BACKGROUND

Cellular communication systems continue to grow in popularity and have become an integral part of both personal and business communications. Cellular telephones allow users to place and receive phone calls most anywhere they travel. Moreover, as cellular telephone technology is advanced, so too has the functionality of cellular devices. For example, many cellular devices now incorporate Personal Digital Assistant (PDA) features such as calendars, address books, task lists, calculators, memo and writing programs, etc. These multi-function devices usually allow users to wirelessly send and receive electronic mail (email) messages and access the internet via a cellular network and/or a wireless local area network (WLAN), for example.

Cellular devices have radio frequency (RF) processing circuits and receive or transmit radio communications signals typically using modulation schemes. Constant envelope signals use phase modulation to represent/encode information; however, their amplitude does not change with time. In contrast, non-constant envelope modulation schemes encode information in amplitude and phase and are typically generated using quadrature transmit paths (I/Q paths). There are several amplitude modulation schemes, such as 8 phase-shift keying (8PSK) used in second generation cellular transceivers, quadrature phase-shift keying (QPSK) used in third generation cellular transceivers, and orthogonal frequency-division multiplexing (OFDM) used in fourth generation cellular transceivers, all typically generated using a quadrature transmitter. In contrast to constant envelope modulation, quadrature modulation and demodulation circuits may create linearity issues with power amplifiers because the peak power transmitted is higher than average power, and therefore the PA is mostly operated in the "backed-off" condition, where it is inefficient. This drawback may be further exacerbated under the condition of poor antenna match. This can cause some degradation of total radiated power (TRP) and raise harmonic interference issues because of the greater non-linearity of a power amplifier.

In particular, cellular devices that use Quadrature modulations circuits may experience difficulty in transmitting large bandwidth signals, for example, third and fourth generation cellular transceiver signals. In particular, the large bandwidth of these signals may demand a fairly linear amplifier, which may prove to be quite power inefficient, thereby hurting battery life.

DETAILED DESCRIPTION OF THE PREFERRED EMBODIMENTS

Figure 1:
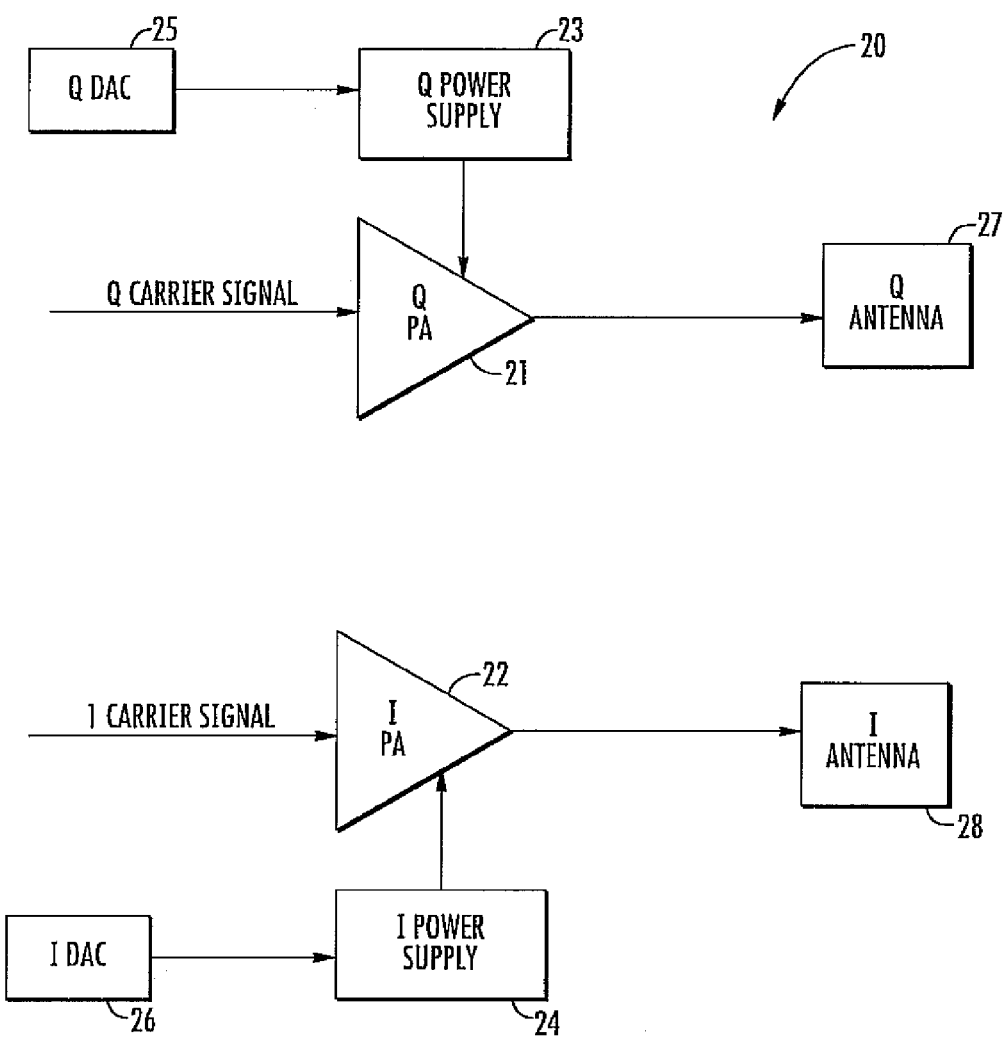
FIG. 1 is a schematic block diagram of an example embodiment of a communications device.

The present description is made with reference to the accompanying drawings, in which embodiments are shown. However, many different embodiments may be used, and thus the description should not be construed as limited to the embodiments set forth herein. Rather, these embodiments are provided so that this disclosure will be thorough and complete. Like numbers refer to like elements throughout, and prime notation is used to indicate similar elements or steps in alternative embodiments.

One aspect of the present disclosure is directed to a communications device. The communications device may comprise an In-phase (I) power amplifier configured to generate an I amplified signal, a Quadrature (Q) power amplifier configured to generate a Q amplified signal, an I digital-to-analog converter (DAC) configured to generate an I signal, and a Q DAC configured to generate a Q signal. The communications device may also comprise an I power supply circuit coupled to the I power amplifier and to the I DAC and configured to cause the I power amplifier to modulate an I carrier signal into the I amplified signal based upon the I signal, a Q power supply circuit coupled to the Q power amplifier and to the Q DAC and configured to cause the Q power amplifier to modulate a Q carrier signal into the Q amplified signal based upon the Q signal, and at least one antenna coupled to the I and Q power amplifiers.

For example, in some embodiments, the communications device may include a power combiner coupled between the I and Q power amplifiers and the antenna. In other embodiments, the communications device may include an I antenna and a Q antenna respectively coupled to the I and Q power amplifiers. More specifically, the I and Q antennas may be physically separated. Advantageously, the I and Q power amplifiers may be configured to operate in a saturated mode of operation.

In some embodiments, the communications device may further comprise an I look-up table (LUT) module upstream of the I DAC and configured to supply a linear I signal thereto, and a Q LUT module upstream of the Q DAC configured to supply a linear Q signal. Additionally, the communications device may further comprise a phase locked loop (PLL) configured to generate the I and Q carrier signals. The PLL may be configured to generate the I and Q carrier signals comprising constant envelop I and Q carrier signals, for example.

Moreover, in some embodiments, the communications device may further include an I pre-amplifier coupled between the PLL and the I power amplifier, and a Q pre-amplifier coupled between the PLL and the Q power amplifier. The communications device may further comprise at lest one of a 90/270-degree phase shifter and a 0/180-degree phase shifter between the PLL and the Q pre-amplifier. Also, the I and Q power supply circuits may each comprise a respective switched mode power supply circuit.

For example, the I and Q antennas may comprise rectangular-shaped strip antennas, and the I and Q rectangular-shaped strip antennas may be adjacent to each other. The I and Q DACs may be operable using at least fourth generation cellular wireless signals.

Another aspect is directed to a method of operating a communications device. The method may include using an I power amplifier to generate an I amplified signal, using a Q power amplifier to generate a Q amplified signal, using an I DAC to generate an I signal, and using a Q DAC to generate a Q signal. The method also may include using an I power supply circuit to cause the I power amplifier to modulate an I carrier signal into the I amplified signal based upon the I signal, using a Q power supply circuit to cause the Q power amplifier to modulate a Q carrier signal into the Q amplified signal based upon the Q signal, and using a least one antenna to transmit the I and Q amplified signals.

Yet another aspect of the present disclosure is directed to another communications device. This communications device may include a plurality of I power amplifiers configured to respectively generate a plurality of I amplified signals, a plurality of Q power amplifiers configured to respectively generate a plurality of Q amplified signals, a plurality of I antennas respectively coupled to the plurality of I power amplifiers, and a plurality of Q antennas respectively coupled to the plurality of Q power amplifiers. This communications device may also include an I controller coupled to the plurality of I power amplifiers and configured to selectively enable at least one of the plurality of I power amplifiers, and a Q controller coupled to the plurality of Q power amplifiers and configured to selectively enable at least one of the plurality of Q power amplifiers.

In some embodiments, the communications device may further comprise an I DAC configured to generate an I bias current signal for the plurality of I power amplifiers, and a Q DAC configured to generate a Q bias current signal for the plurality of Q power amplifiers. Moreover, in these embodiments, the communications device may further comprise an I LUT module upstream of the I DAC and configured to supply a linear I signal thereto, and a Q LUT module upstream of the Q DAC and configured to supply a linear Q signal thereto.

In other embodiments, the I controller may be configured to cause the plurality of I power amplifiers to modulate an I carrier signal into the plurality of amplified signals based upon an I digital baseband signal. Moreover, the Q controller may also be configured to cause the plurality of Q power amplifiers to modulate a Q carrier signal into the plurality of Q amplified signals based upon a Q digital baseband signal.

For example, each I and Q antenna may comprise a respective rectangular-shaped strip antenna, and the pluralities of I and Q rectangular-shaped strip antennas may be adjacent to each other.

Another aspect is directed to a method of operating a communications device. The method may include using a plurality of I power amplifiers to respectively generate a plurality of I amplified signals, and using a plurality of Q power amplifiers to respectively generate a plurality of Q amplified signals. The method may also include using an I controller to selectively enable at least one of a plurality of I power amplifiers, and using a Q controller to selectively enable at least one of a plurality of Q power amplifiers.

Another aspect of the present disclosure is directed to a communications device. This communications device may include a plurality of I power amplifiers configured to respectively generate a plurality of I amplified signals, a plurality of Q power amplifiers configured to generate a plurality of Q amplified signals, an I controller coupled to the plurality of I power amplifiers and configured to selectively enable at least one of the plurality of I power amplifiers, and a Q controller coupled to the plurality of Q power amplifiers and configured to selectively enable at least one of the plurality of Q power amplifiers. This communications device may also include a power combiner configured to combine the plurality of I amplified signals and the plurality of Q amplified signals in a combined amplified signal, and an antenna coupled to the power combiner.

In some embodiments, the communications device may further comprise an I DAC configured to generate an I bias current signal for the plurality of I power amplifiers, and a Q DAC configured to generate a Q bias current signal for the plurality of Q power amplifiers. These embodiments of the communications device may further comprise an I LUT module upstream of the I DAC and configured to supply a linear I signal thereto, and a Q LUT module upstream of the Q DAC and configured to supply a linear Q signal thereto.

Other embodiments of the communications device may include the I controller being configured to cause the plurality of I power amplifiers to modulate an I carrier signal into the plurality of I amplified signals based upon an I digital baseband signal. Moreover, the Q controller may configured to cause the plurality of Q power amplifiers to modulate a Q carrier signal into the plurality of Q amplified signals based upon a Q digital baseband signal. The communications device may further comprise a phase locked loop (PLL) configured to generate the I and Q carrier signals. The PLL may be configured to generate the I and Q carrier signals comprising constant envelop I and Q carrier signals.

Another aspect is directed to a method of operating a communications device. The method may also include using a plurality of I power amplifiers to respectively generate a plurality of I amplified signals, using a plurality of Q power amplifiers to generate a plurality of Q amplified signals, and using an I controller to selectively enable at least one of the plurality of I power amplifiers. The method may also include using a Q controller to selectively enable at least one of the plurality of Q power amplifiers, using a power combiner to combine the plurality of I amplified signals and the plurality of Q amplified signals in a combined amplified signal, and using an antenna to transmit the combined amplified signal.

Example communications devices may include portable or personal media players (e.g., music or MP3 players, video players, etc.), remote controls (e.g., television or stereo remotes, etc.), portable gaming devices, portable or mobile telephones, smartphones, tablet computers, etc.

Referring now to FIG. 1, a communications device 20 according to the present disclosure is now described. The communications device 20 illustratively includes an I power amplifier 22 configured to generate an I amplified signal, a Q power amplifier 21 configured to generate a Q amplified signal, an I DAC 26 configured to generate an I signal, and a Q DAC configured to generate a Q signal. The I and Q DACs 25-26 may be operable using third or fourth generation cellular wireless signals, for example, Long Term Evolution (LTE), Mobile WiMAX (IEEE 802.16e-2005), etc. Of course, as will be appreciated by those skilled in the art, other next generation signals may be implemented in the communications device 20 with appropriate modification.

The communications device 20 illustratively includes an I power supply circuit 24 coupled to the power amplifier 22 and to the I DAC 26 and configured to cause the I power amplifier to modulate an I carrier signal into the I amplified signal based upon the I signal. The communications device 20 illustratively includes a Q power supply circuit 23 coupled to the Q power amplifier 21 and to the Q DAC 25 and configured to cause the Q power amplifier to modulate a Q carrier signal into the Q amplified signal based upon the Q signal. The I and Q power supply circuits 23-24 effect the modulation by varying a power supply voltage used by the I and Q power amplifiers 21-22.

Also, the communications device 20 illustratively includes an I antenna 28 coupled to the I power amplifier 22, and a Q antenna 27 coupled to the Q power amplifier 21. More specifically, the I and Q antennas 28, 27 are illustratively physically separated but adjacent to each other, for example, spaced parallel to each other and at 100 µm apart. The antennas 28, 27 are kept close together such that the radiation pattern around them is as desired when the two operate simultaneously, one radiating I path RF and the second radiating the Q path RF. For example, the I and Q antennas 27-28 are illustratively rectangular-shaped strip antennas that are adjacent to each other. Of course, in other embodiments, the I and Q antennas 27-28 may have other shapes.

In other words, the combination of the amplified I and Q signals occurs over-the-air and not upstream the antenna as in typical communications devices. Advantageously, the combination medium of air is quite favorable since it is a linear medium with high dynamic range. Moreover, since the I and Q carrier signals are constant envelop signals, the I and Q power amplifiers 21-22 may operate in a saturated operation mode, which is energy efficient, rather than the linear mode, as in the typical communications device. Indeed, in the typical communications device, a linear mode amplifier may be required to successfully transmit the wideband third and fourth generation wireless cellular signals. Unfortunately, this leads to undesirably low battery life. In the disclosed communications device 20, the battery life is advantageously lengthened due to power amplifier efficiency.

Figure 2:
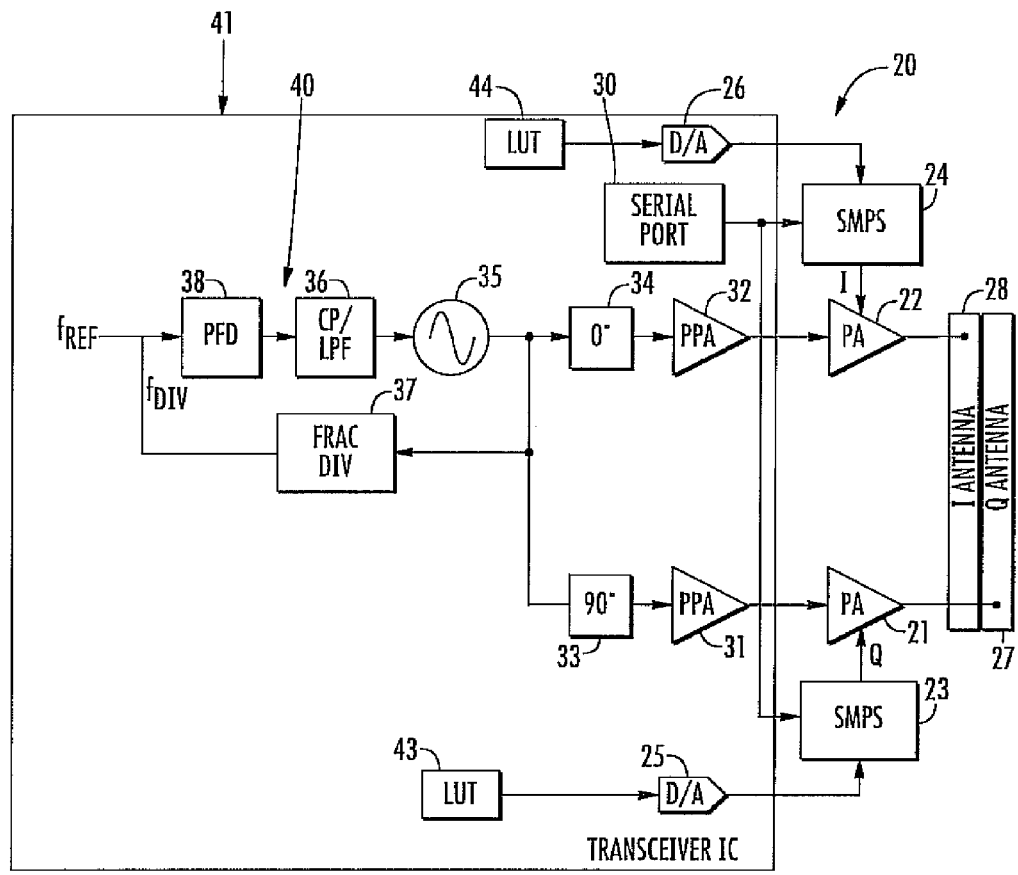
FIG. 2 is a detailed schematic block diagram of the communications device of FIG. 1.

Referring now to FIG. 2, the communications device 20 illustratively includes a transceiver integrated circuit (IC) 41. With the exception of the I and Q power supply circuits 23-24, the I and Q power amplifiers 21-22, and the I and Q antennas 27-28, the transceiver IC 41 provides the processing resources for all other components of the communications device 20.

The communications device 20 illustratively includes an I LOT module 44 upstream of the I DAC 26 and configured to supply a linear I signal thereto, and a Q LOT module 43 upstream of the Q DAC 25 configured to supply a linear Q signal. The I and Q LUT modules 43-44 ensure that the applied digital modulation signal is represented linearly at the supply voltage of the I and Q power amplifiers 21-22 as it goes through the I and Q DACs 25-26, the reference input of the I and Q power supply circuits 23-24 (which are illustratively shown as switched mode power supplies DC-DC (SMPS)), and then to the voltage supplied to the I and Q power amplifiers. As would be appreciated by the skilled person, the output power versus reference input voltage of the illustrated SMPS I and Q power amplifiers 21-22 is not linear. Hence, the I and Q LUT modules 43-44 provide the necessary translation (look-up & interpolation/extrapolation) so that the output power is a linear function of the DAC code applied at the input of the LUT respective module.

Moreover, in some embodiments, envelope tracking of the digital baseband I and Q signals may be implemented using the I and Q power supply circuits 23-24. As will be appreciated by the skilled person, the communications device 20 may include a pair of duplexers (not shown) for providing a full duplex transceiver.

The I and Q LOT modules 43-44 are used to linearize the output power versus the digital baseband I and Q signals. This is accomplished using calibration. In particular, the digital baseband I signal is swept and the output power is measured. The LUT entries are determined such that the transfer characteristics of digital input to output power are linear.

Additionally, the communications device 20 illustratively includes a PLL 40 configured to generate the I and Q carrier signals. The PLL 40 may be configured to generate the I and Q carrier signals comprising constant envelop I and Q carrier signals, for example. More specifically, the PLL 40 illustratively includes a phase frequency detector (PFD) 38, a low pass filter 36 downstream therefrom, a signal generator 35 (e.g., a voltage controller oscillator (VCO)) downstream therefrom, and a frequency divider 37 coupled between the signal generator and the PFD.

Moreover, in the illustrated embodiment, the communications device 20 illustratively includes an I pre-amplifier 32 coupled upstream the I power amplifier 22, and a Q pre-amplifier 31 coupled upstream the Q power amplifier 21. The communications device 20 illustratively includes a 90-degree phase shifter 33 coupled between the PLL 40 and the Q pre-amplifier 31, and a 0 degrees phase shifter 34 coupled between the PLL 40 and the I pre-amplifier 32. The communications device 20 also illustratively includes a serial port module 30 coupled to the I power supply circuit 24. In the illustrated SMPS embodiment, the serial port module 30 is used to control the operating characteristics of the I and Q power supply circuits 23-24 and to exercise programmability offered by the SMPS, such as internal BW control etc. or switching between PWM and PFM modes etc. as deemed appropriate by the software running in the processor in the transceiver or the baseband processor.

Moreover, as will be appreciated by those skilled in the art, the VCO (signal generator 35) may be operated at 2× or even 4× the carrier frequency, and one or more frequency dividers 37 may be used to divide the frequency to the specified carrier frequency. This is done to help the transceiver IC 41 fight frequency pulling where the high output power at the I and Q power amplifiers 21-22 centered as the carrier frequency couples to the VCO and corrupts the phase noise.

An advantage of such frequency division is that all four phases 0°, 90°, 180° and 270° of the RF carrier are readily available. Since the power can only be positive, the I and Q DACs 25-26 can only provide a positive signal to the I and Q power supply circuits 23-24, which can only produce a voltage between ground and $V_{BATT}$. Hence, in contrast to a typical up-conversion mixer that may allow positive and negative baseband input voltage, this communications device 20 does not directly allow negative inputs.

The way to accommodate the negative I DAC 26 input is to choose 180° phase and to apply the inverted carrier to the I power amplifier 22 input. Hence, positive I DAC values apply 0° phase to the I power amplifier 22 input, and negative I DAC values apply 180°phase to the I power amplifier input. Similarly, positive Q DAC values apply 90° phase to the Q power amplifier 21 input, and negative Q DAC values apply 270°phase to the Q power amplifier input. This is done by using the sign bit to control a multiplexer (FIG. 15) that allows one or the other phase of the carrier signal to the I and Q power amplifier 21-22 inputs. Hence, one multiplexer is needed for I path and the second for Q path. The magnitudes of I DAC and Q DAC values are always positive and, therefore, are applied to the respective DACs 25-26.

In FIG. 2, it is assumed that the 0-degrees phase shifter 34 provides 0° or 180° phase shifting based upon the sign of the I DAC input to I power amplifier 22, and the 90-degrees phase shifter 33 provides 90° or 270°phase shifting based upon the sign of Q DAC input to Q power amplifier 21. The phase shifter 34 can be implemented using a multiplexer with inputs 0° or 180°and the sign bit of I DAC input choosing 0° phase for positive inputs and 180° phase for negative inputs. Similarly, the phase shifter 33 can be implemented using inputs 90° and 270° from the PLL 40 going into a second multiplexer with 90° selected when Q DAC input is positive and 270° when it is negative. Of course, this variation of the phase shifters may also be applicable to the PLL circuits in other embodiments disclosed herein.

In other embodiments, 2× or 4× rate VCO 35 outputs can be divided to directly obtain the four needed phases. More specifically, instead of generating the 90°/270° and 180° degree phases, the VCO 35 in the PLL 40 may be designed at 2× or 4× or even higher frequency and its output divided to obtain the needed four phases 0°, 90°, 180° and 270° needed in accordance with quadrature up-conversion. Phase 0° or 180° PLL outputs are applied to the I power amplifier 22, and the sign of I signal determines the selection between 0° and 180°.

Figure 3:
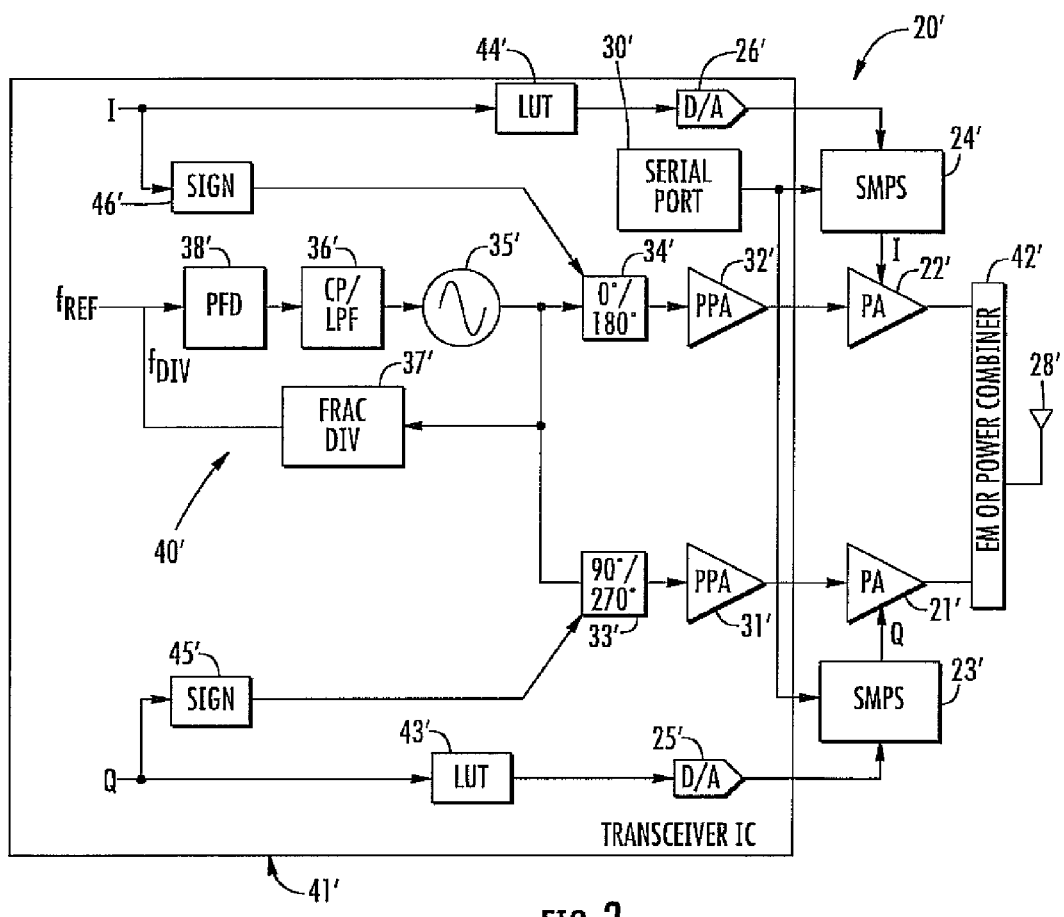
FIG. 3 is a detailed schematic block diagram of another embodiment of the communications device of FIG. 1.

Referring now to FIG. 3, another embodiment of the communications device 20 is now described. In this embodiment of the communications device 20', those elements already discussed above with respect to FIGS. 1-2 are given prime notation and most require no further discussion herein. This embodiment differs from the previous embodiment in that the communications device 20'exchanges the separate I and Q antennas for a single antenna 28', and further includes a power combiner 42'coupled between the antenna and the I and Q power amplifiers 21'-22'. Moreover, this communications device 20' illustratively includes I and Q controllers 45'-46'coupled upstream of respective I and Q LUT modules 43'-44' for selecting the desired phase shift for the respective phase shifters 33'-34'.

Figure 15:
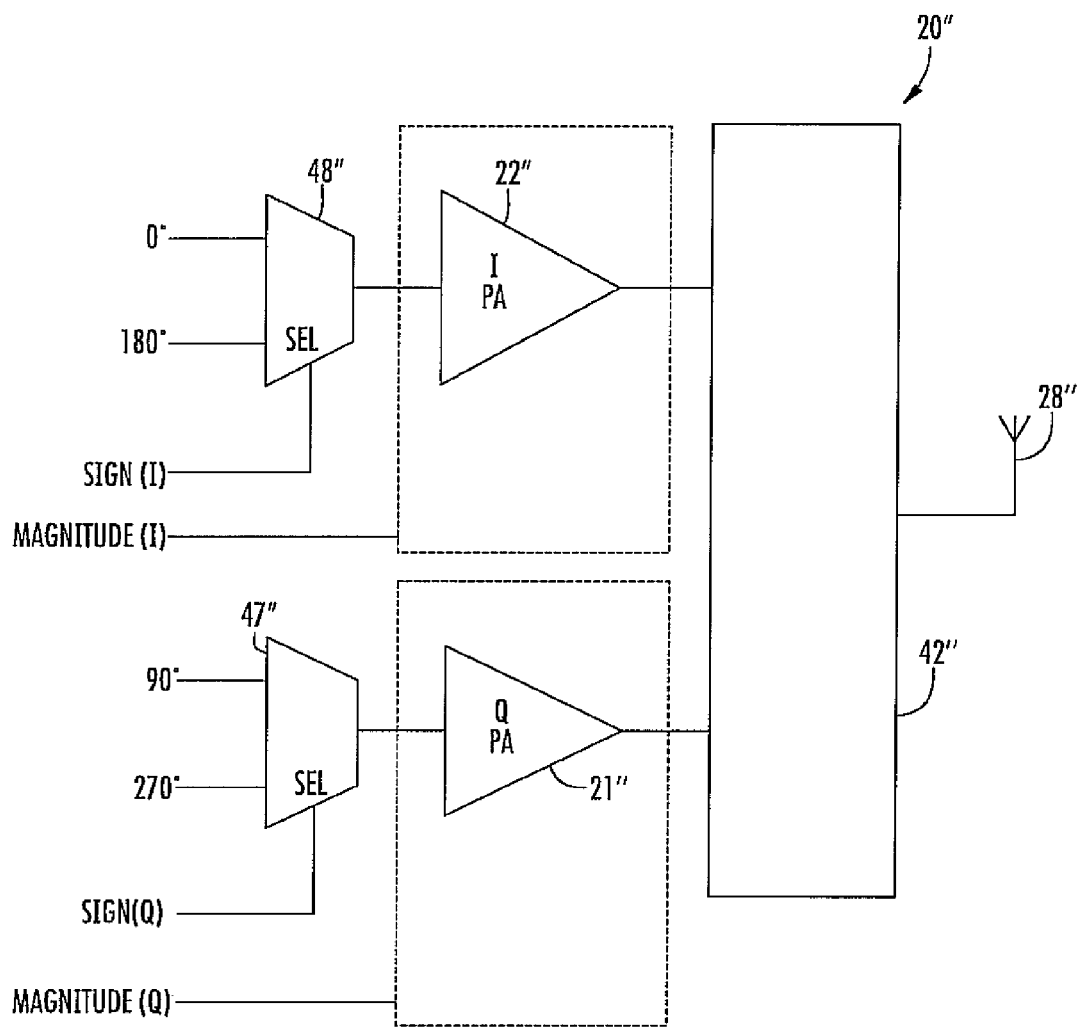
FIG. 15 is a schematic block diagram of another embodiment of the communications device of FIG. 3.

Referring briefly and additionally to FIG. 15, another embodiment of the communications device 20 is now described. In this embodiment of the communications device 20", those elements already discussed above with respect to FIG. 3 are given double prime notation and most require no further discussion herein. This embodiment differs from the previous embodiment in that the communications device 20" includes a pair of multiplexers 47"-48" coupled upstream of the I and Q power amplifiers 21"-22" for selectively providing the phase shifted and I and Q signals, as discussed hereinabove.

Figure 4:
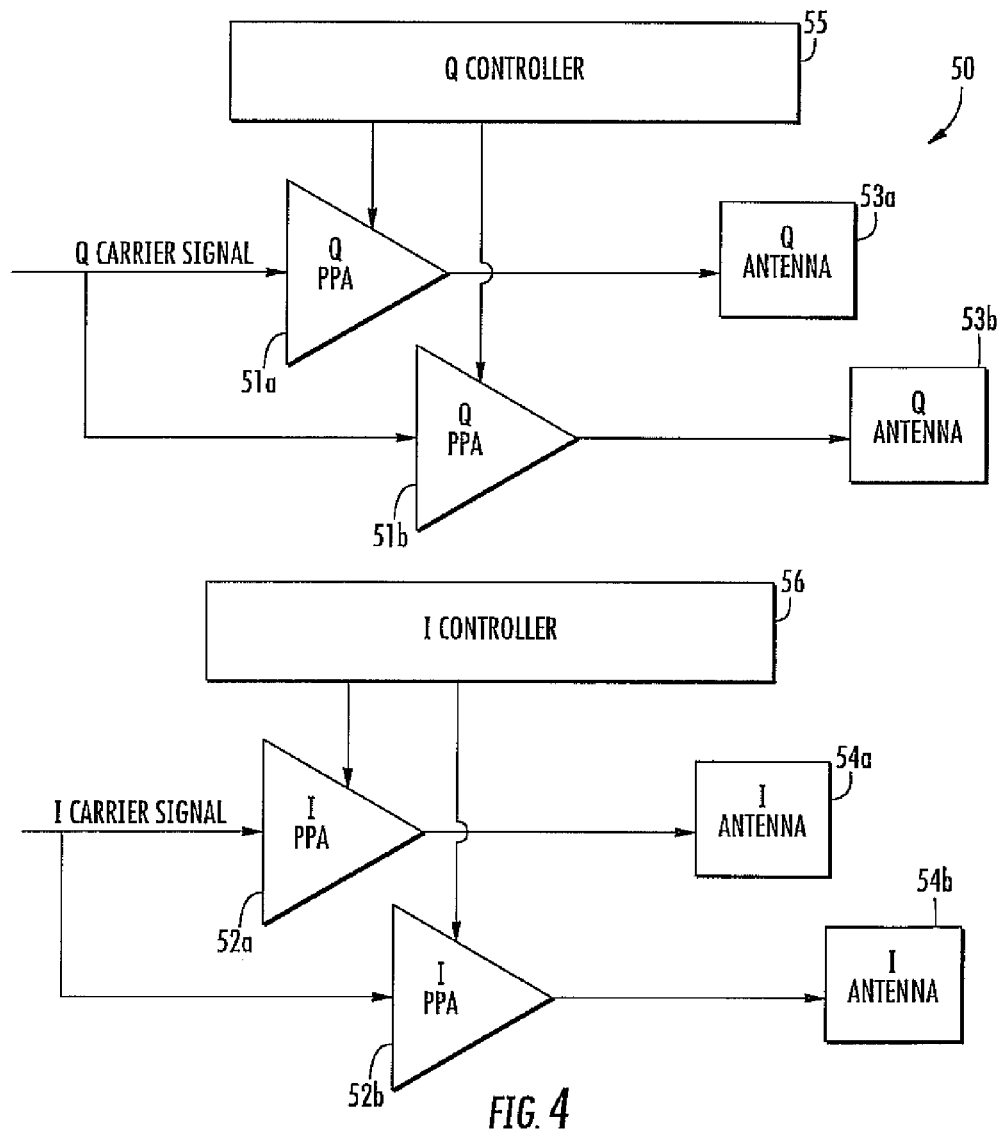
FIG. 4 is a schematic block diagram of an example embodiment of a communications device.

Referring now to FIG. 4, another embodiment of a communications device 50 is now described. This communications device 50 illustratively includes a plurality of I power amplifiers 52a-52b configured to respectively generate a plurality of I amplified signals, a plurality of Q power amplifiers 51a-51b configured to respectively generate a plurality of Q amplified signals, a plurality of I antennas 54a-54b respectively coupled to the plurality of I power amplifiers, and a plurality of Q antennas 53a-53b respectively coupled to the plurality of Q power amplifiers.

The communications device 50 illustratively includes an I controller 56 coupled to the plurality of I power amplifiers 52a-52b and configured to selectively enable at least one of the plurality of I power amplifiers, and a Q controller 55 coupled to the plurality of Q power amplifiers 51a-51b and configured to selectively enable at least one of the plurality of Q power amplifiers. In particular, the I and Q controllers 55-56 enable as many power amplifiers 51a-52b as needed to successfully transmit the signal. For example, fewer power amplifiers 51a-52b would be enabled when the communications device is near a network tower. Because of this selective enabling of the power amplifiers 51a-52b, power-added efficiency (PAE) versus power output is advantageously high. Those skilled in art will appreciate that the communications device 50 acts as an effective DAC that produces an electromagnetic output power directly controlled by the I and Q controllers 55-56. This effective DAC can also be called a digital-to-electromagnetic converter (DEC).

Of course, as will be appreciated by the skilled person, the illustrated embodiment includes two I and two Q power amplifiers 51a-51b, but other embodiments may include varying numbers, which may depend on the desired application. For example, the communications device 50 may include 50 I power amplifiers and 50 Q power amplifiers, each generating 20 mW of power for a total maximum potential power output of 2 W. Advantageously, since the power output of each power amplifier 41a-52b is reduced, the power amplifiers may be provided by a single transceiver chip along with the other signal processing elements, rather than being off-chip.

In another example, a 10-bit DEC can be designed by placing 1024 pre-power amplifiers and associated antenna segments. The digital control signal now directly selects the output power produced. As described above, the sign bit of the digital signal can be used to flip the carrier signal at the pre-power amplifiers inputs by 180°. The pre-power amplifier segments can be constructed using similar techniques used to build typical current source based DACs and using binary-to-thermometer encoding to select the pre-power amplifiers. Those skilled in the art can appreciate a wide range of typical DACs that can directly be applied in this embodiment to DECs.

Figure 5:
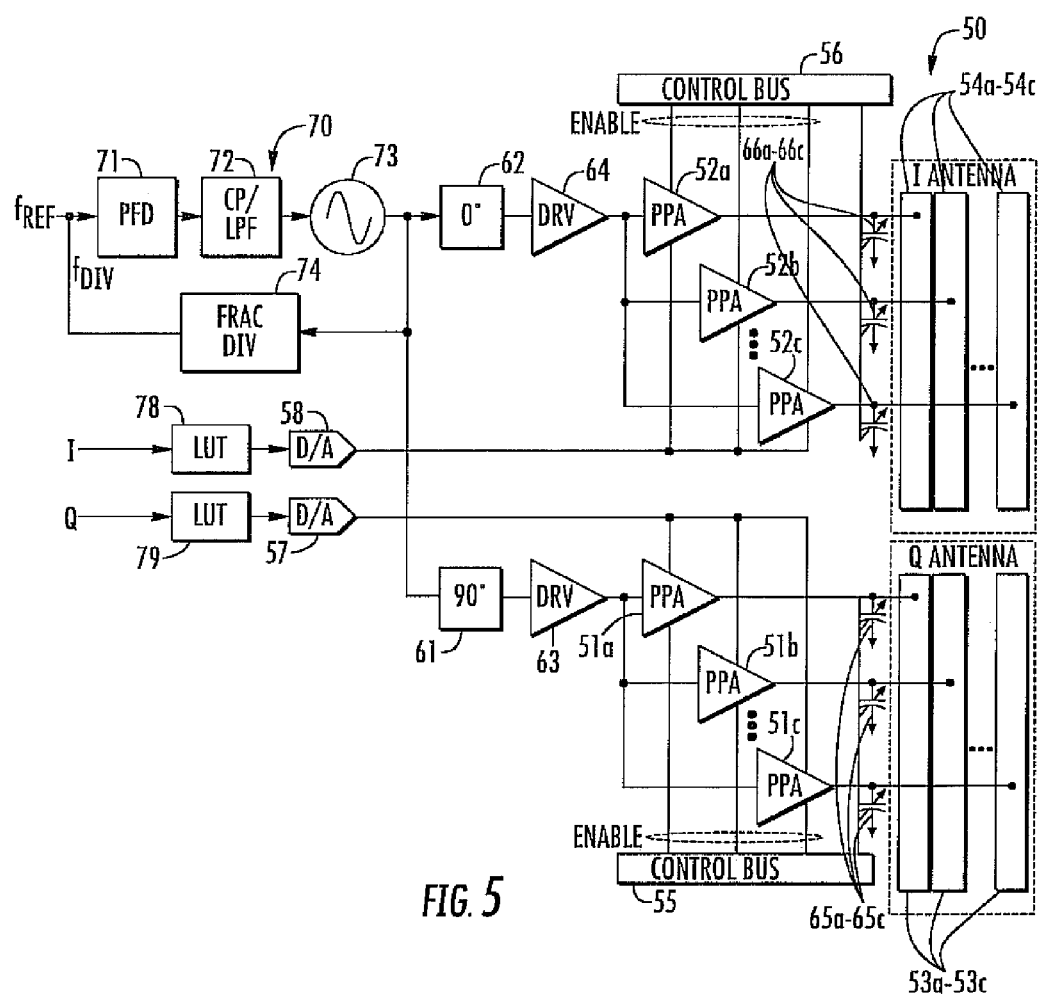
FIG. 5 is a detailed schematic block diagram of the communications device of FIG. 4.

Referring now to FIG. 5, the communications device 50 illustratively includes an I DAC 58 configured to generate an I bias current signal for the plurality of I power amplifiers 52a-52c, and a Q DAC 57 configured to generate a Q bias current signal for the plurality of Q power amplifiers 51a-51c. In other words, the bias currents to the power amplifiers 51a-52c are manipulated to effect the modulation of the I and Q carrier signals.

Moreover, in the illustrated embodiment, the communications device 50 includes an I LUT module 78 upstream of the I DAC 58 and configured to supply a linear I signal thereto, and a Q LUT module 79 upstream of the Q DAC 57 and configured to supply a linear Q signal thereto. The I and Q LUT modules 78-79 are configured similarly to those of the embodiments of FIGS. 2-3.

Additionally, the communications device 50 illustratively includes a PLL 70 configured to generate the I and Q carrier signals. The PLL 70 may be configured to generate the I and Q carrier signals comprising constant envelop I and Q carrier signals, for example. More specifically, the PLL 70 illustratively includes a phase frequency detector (PFD) 71, a low pass filter 72 downstream therefrom, a signal generator 73 downstream therefrom, and a frequency divider 74 coupled between the signal generator and the PFD.

Moreover, in the illustrated embodiment, the communications device 50 illustratively includes an I driver 64 coupled upstream the I power amplifiers 52a-52c, and a Q driver 63 coupled upstream the Q power amplifiers 51a-51c. The communications device 50 illustratively includes a 90-degree phase shifter 61 coupled between the PLL 70 and the Q driver 63, and a 0 degrees phase shifter 62 coupled between the PLL 70 and the I driver 64. As described above, the phase shifters 61-62 can be implemented by designing the VCO 73 at 2× or 4×RF carrier frequency and dividing the frequency down to obtain the carrier frequency. Using sign bit of DAC input and 2:1 multiplexer, these phase shifters 61-62 can be easily implemented as described earlier. Also, the communications device illustratively includes I and Q matching networks 66a-66c, 65a-65c respectively coupled between the I and Q antennas 54a-54c, 53a-53c and the I and Q power amplifiers 52a-52c, 51a-51c. The I and Q matching networks 66a-66c, 65a-65c may be programmable and controlled digitally for antenna tuning, i.e. varying voltage standing wave ratio (VSWR) at the antenna load.

Indeed, in some embodiments (not shown), the output of the power amplifiers 51a-52b can be parasitically coupled, down-converted and analog-to-digital (ADC) converted in the small signal IC. Alternatively, a trace close to the antennas 53a-54c can pick up the signal and feed it back into the small signal IC where it is down-converted either using a receiver or a log-Amp followed by an ADC. The tuning elements for matching can be controlled to provide desirable tuning for output power under varying VSWR at the antenna 53a-54c.

Figure 6:
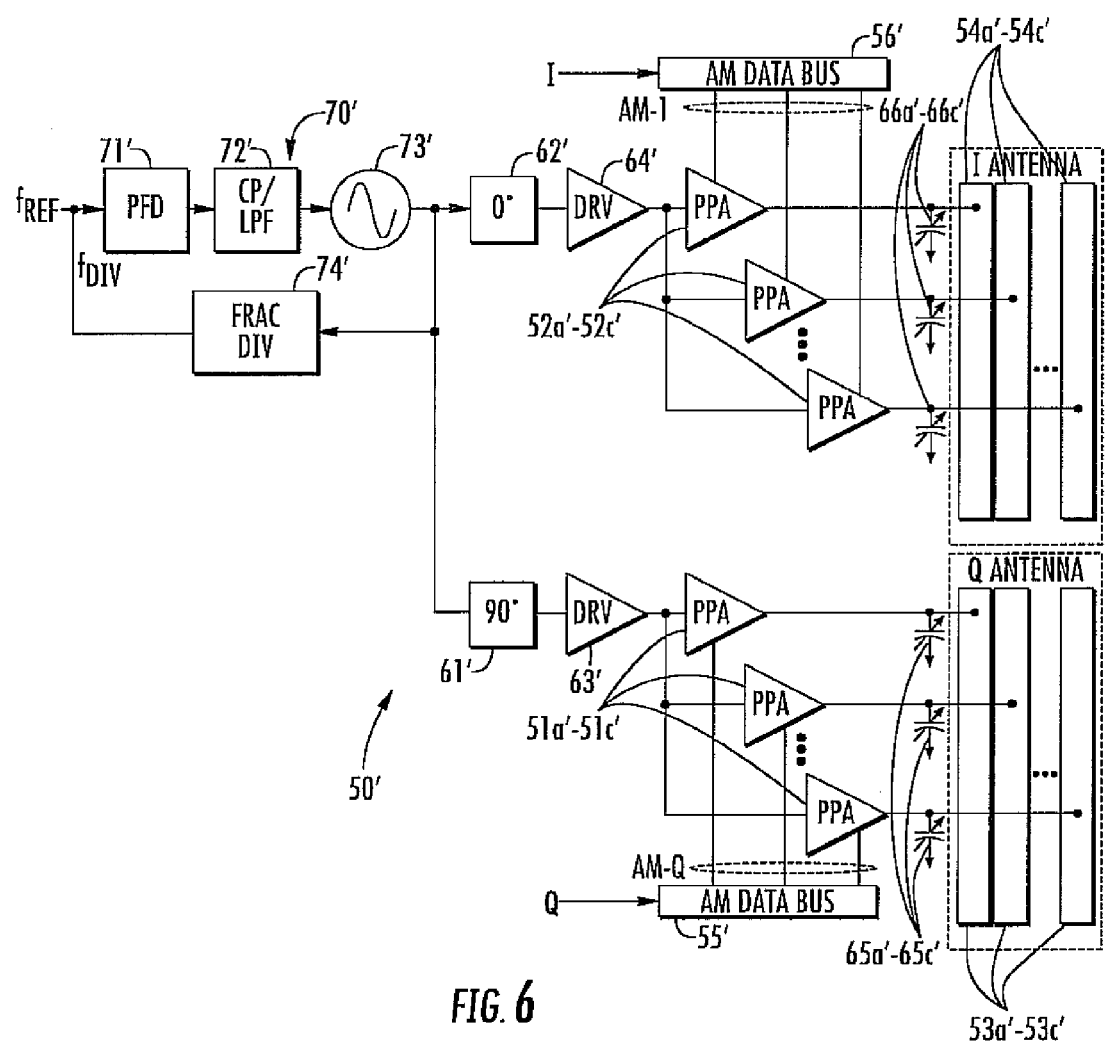
FIG. 6 is a detailed schematic block diagram of another embodiment of the communications device of FIG. 4.

Referring now to FIG. 6, another embodiment of the communications device 50 is now described. In this embodiment of the communications device 50', those elements already discussed above with respect to FIGS. 4-5 are given prime notation and most require no further discussion herein. This embodiment differs from the previous embodiment in that the communications device 50'does not include the I and Q DACs and LUT modules. Rather, in this embodiment, the I and Q power amplifiers 51a'-52c' are manipulated to modulate the I and Q carrier signals via the I and Q controllers 55'-56'. In other words, the I controller 56' is configured to cause the plurality of I power amplifiers 52a'-52c' to modulate an I carrier signal into the plurality of I amplified signals based upon an I digital baseband signal, and the Q controller 55' is configured to cause the plurality of Q power amplifiers 51a'-51c' to modulate a Q carrier signal into the plurality of Q amplified signals based upon a Q digital baseband signal. In particular, the communications device 50' forms an effective DAC, and the sign of the DAC input controls the appropriate phase carrier to be selected, similar to as described for earlier embodiments. The digital value is converted to magnitude and controls the number of devices that are turned on. In this embodiment of a DEC, the antenna segment is a part of the effective DAC.

Figure 7:
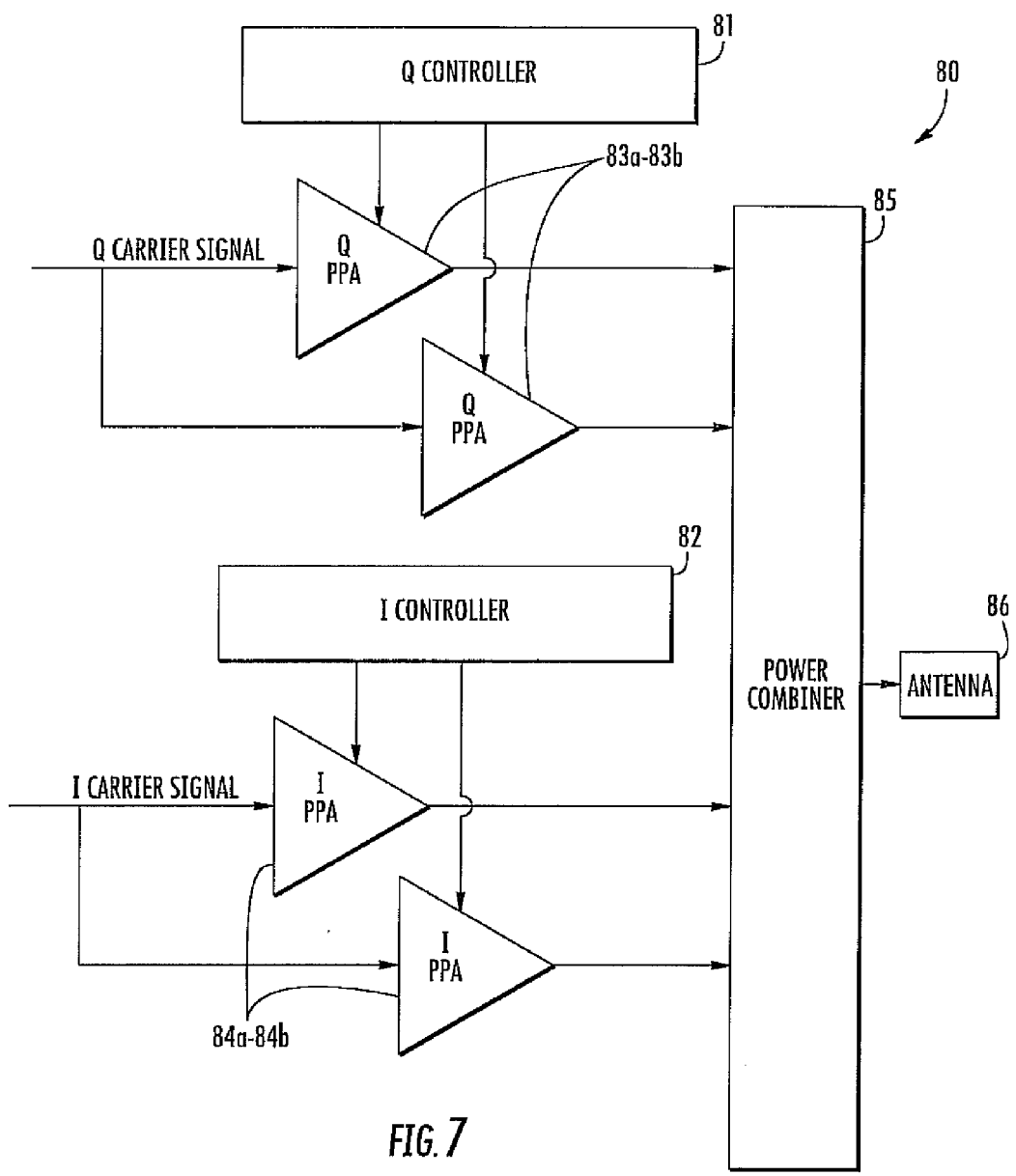
FIG. 7 is a schematic block diagram of an example embodiment of a communications device.

Referring now to FIG. 7, another embodiment of a communications device 80 is now described. This communications device 80 illustratively includes a plurality of I power amplifiers 84a-84b configured to respectively generate a plurality of I amplified signals, a plurality of Q power amplifiers 83a-83b configured to generate a plurality of Q amplified signals, an I controller 82 coupled to the plurality of I power amplifiers and configured to selectively enable at least one of the plurality of I power amplifiers, and a Q controller 81 coupled to the plurality of Q power amplifiers and configured to selectively enable at least one of the plurality of Q power amplifiers. This communications device 80 illustratively includes a power combiner 85 configured to combine the plurality of I amplified signals and the plurality of Q amplified signals in a combined amplified signal, and an antenna 86 coupled to the power combiner.

Figure 8:
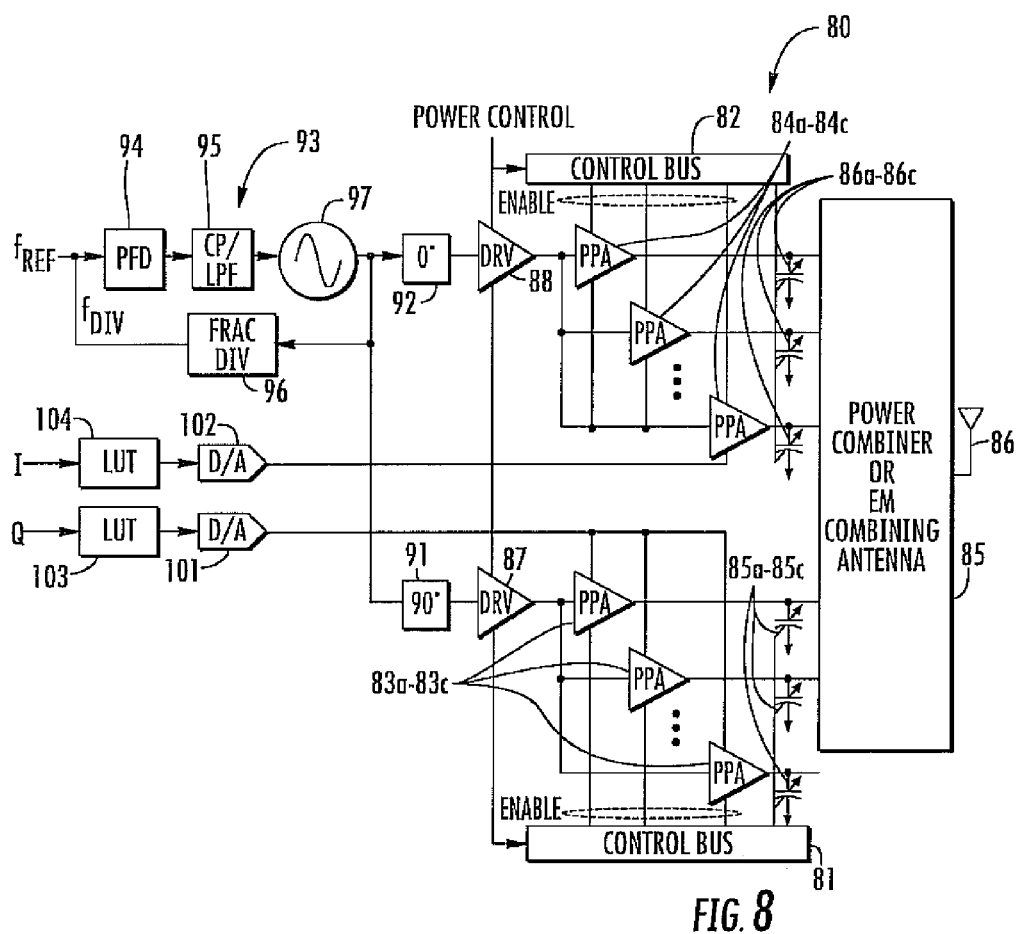
FIG. 8 is a detailed schematic block diagram of the communications device of FIG. 7.

Referring now to FIG. 8, the communications device 80 illustratively includes an I DAC 102 configured to generate an I bias current signal for the plurality of I power amplifiers 84a-84c, and a Q DAC 101 configured to generate a Q bias current signal for the plurality of Q power amplifiers 83a-83c. In other words, the bias currents to the power amplifiers 83a-84c are manipulated to effect the modulation of the I and Q carrier signals.

Moreover, in the illustrated embodiment, the communications device 80 includes an I LUT module 104 upstream of the I DAC 102 and configured to supply a linear I signal thereto, and a Q LUT module 103 upstream of the Q DAC 101 and configured to supply a linear Q signal thereto. The I and Q LUT modules 103-104 are configured similarly to those of the embodiments of FIGS. 2-3.

Additionally, the communications device 80 illustratively includes a PLL 93 configured to generate the I and Q carrier signals. The PLL 93 may be configured to generate the I and Q carrier signals comprising constant envelop I and Q carrier signals, for example. More specifically, the PLL 93 illustratively includes a phase frequency detector (PFD) 94, a low pass filter 95 downstream therefrom, a signal generator 97 downstream therefrom, and a frequency divider 96 coupled between the signal generator and the PFD.

Moreover, in the illustrated embodiment, the communications device 80 illustratively includes an I driver 88 coupled upstream the I power amplifiers 84a-84c, and a Q driver 87 coupled upstream the Q power amplifiers 83a-83c. The communications device 80 illustratively includes a 90-degree phase shifter 91 coupled between the PLL 93 and the Q driver 87, and a 0 degrees phase shifter 92 coupled between the PLL 93 and the I driver 88. Also, the communications device 80 illustratively includes I and Q capacitors 86a-86c, 85a-85c respectively coupled between the power combiner 85 and the I and Q power amplifiers 84a-84c, 83a-83c, each of the capacitors being coupled to a ground potential. As described above, the phase shifters 91-92 can be implemented by designing the VCO 97 at 2× or 4×RF carrier frequency and dividing the frequency down to obtain the carrier frequency. Using sign bit of DAC input and 2:1 multiplexer, these phase shifters 91-92 can be easily implemented as described earlier.

Figure 9:
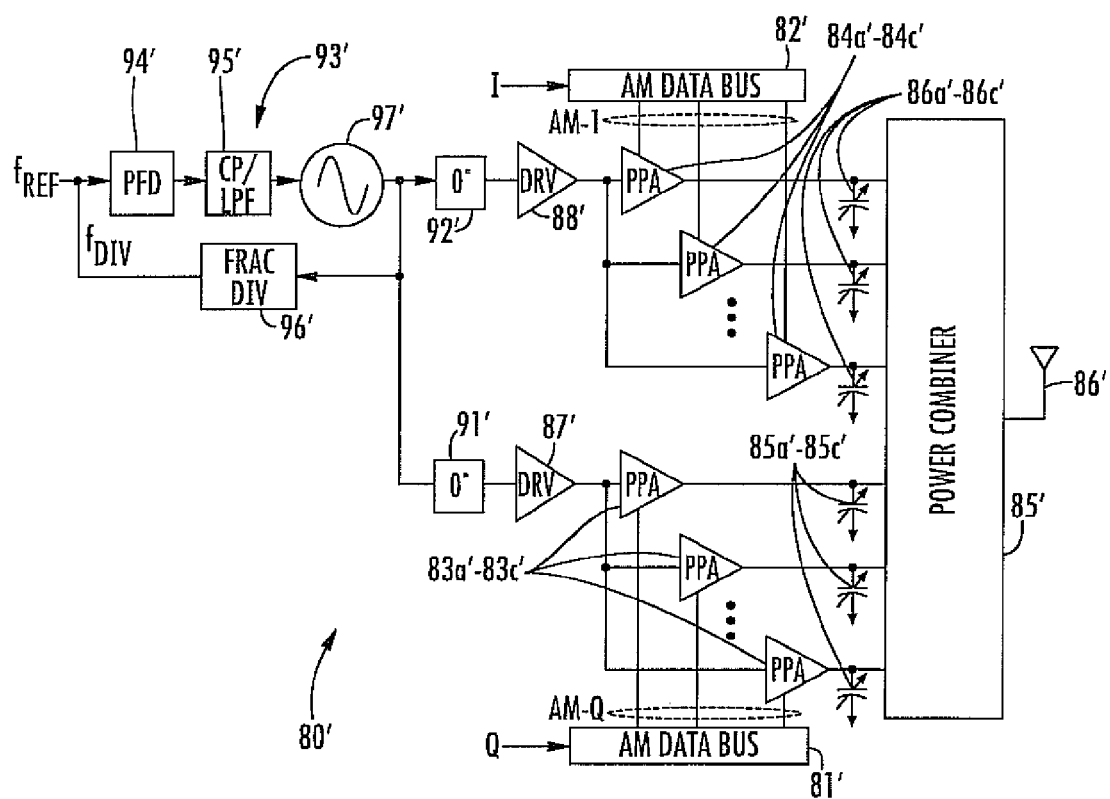
FIG. 9 is a detailed schematic block diagram of another embodiment of the communications device of FIG. 7.
Figure 10:
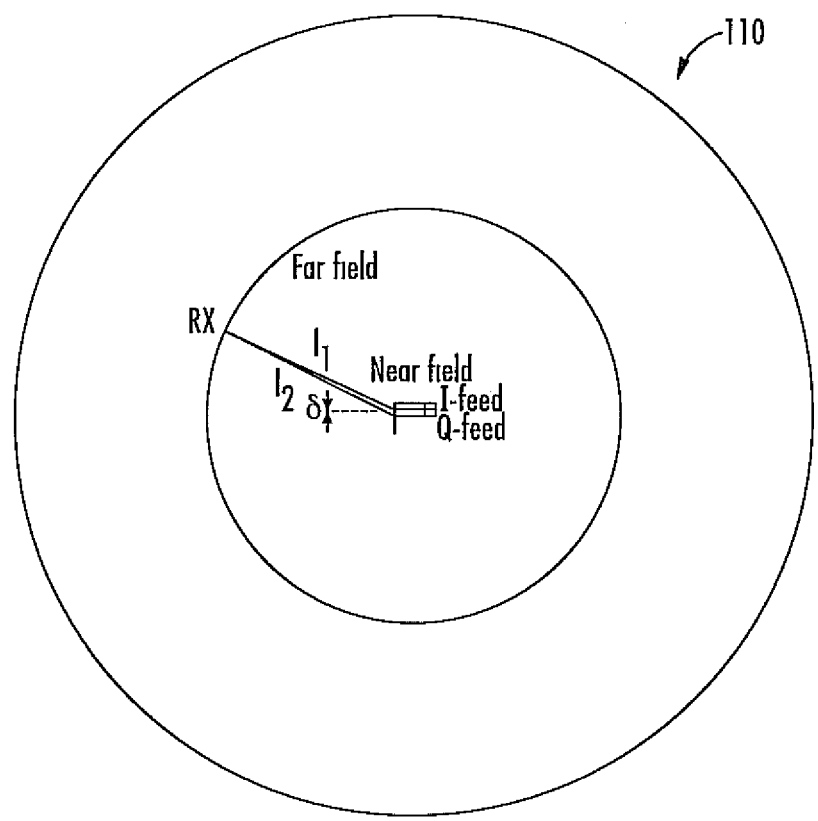
FIG. 10-13 are diagrams illustrating a simulation of the communications device of FIG. 1.
Figure 11:
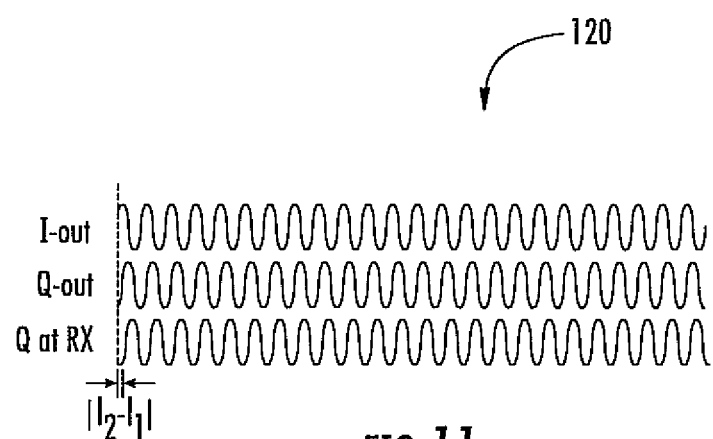
Figure 12:
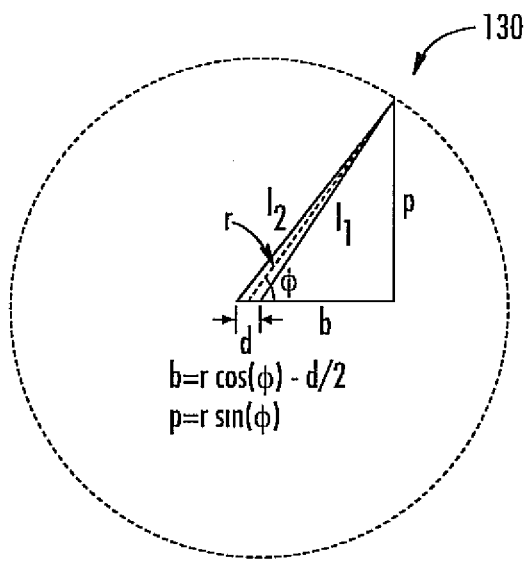

Referring now to FIG. 9, another embodiment of the communications device 80 is now described. In this embodiment of the communications device 80', those elements already discussed above with respect to FIGS. 7-8 are given prime notation and most require no further discussion herein. This embodiment differs from the previous embodiment in that the communications device 80'does not include the I and Q DACs and LUT modules. Rather, in this embodiment, the I and Q power amplifiers 83a'-84c' are manipulated to modulate the I and Q carrier signals via the I and Q controllers 81'-82'. In other words, the I controller 82' is configured to cause the plurality of I power amplifiers 84a'-84c' to modulate an I carrier signal into the plurality of I amplified signals based upon an I digital baseband signal, and the Q controller 81' is configured to cause the plurality of Q power amplifiers 83a'-83c' to modulate a Q carrier signal into the plurality of Q amplified signals based upon a Q digital baseband signal.

The I and Q controllers 81'-82' operate similarly to those of the embodiment described above in FIG. 6. This embodiment here differs from the DEC described above in that each DAC element now only drives a segment of the power combiner 85' and produces an RF output. Hence, it is more appropriately an effective digital-to-RF (D-RF) converter.

Typical methods can be used to build the power combiner 85', which can be implemented as a transformer with many primaries and a single secondary that drives the antenna 86'. It is beneficial to combine the output power passively to keep the output power combination very linear. Passive N:1 combiner structures can be employed; one D-RF converter element drives one combiner element at its input. The D-RF converter can be implemented using typical techniques used to build DACs, such as arraying carefully to reduce the impact of INL and DNL, binary to thermometer coding, shuffling the row-column decoders of binary-to-thermometer encoder using barrel shifters to implement dynamic element matching, employing dynamic weighted averaging etc.

Referring now to FIGS. 10-13, a simulation of the efficacy of the transmission characteristics of the communications device 20 described in FIGS. 1-2 is now described. Diagram 110 shows the combination of the amplified I and Q signals over the air while chart 120 illustrates the I and Q waveforms emitted by the I and Q antennas 27-28. The chart 120 shows that one wave travels slightly more than the other with the distance shown as. $|l_2-l_1|$.

With reference to diagram 130, the formula:

$$|l_2-l_1| = |\sqrt{(r\cos(\phi)+d/2)^2+r^2\sin^2(\phi)} - \sqrt{(r\cos(\phi)-d/2)^2+r^2\sin^2(\phi)}|$$

is illustrated. If r=kd, the formula resolves to:

$$= |\sqrt{r^2+d^2/4+rd\cos(\phi)} - \sqrt{r^2+d^2/4-rd\cos(\phi)}|$$

Figure 13:
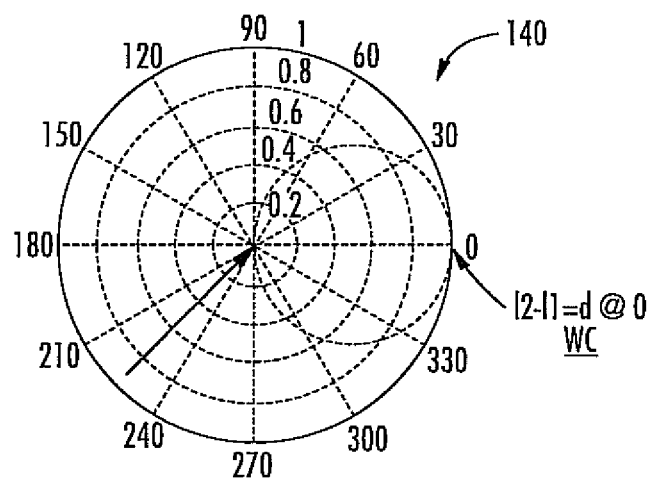

The plot of $|l_2-l_1|$ is shown in diagram 140 of FIG. 13. At 2 GHz and 150 mm away from the antenna, the experienced IQ imbalance is 2.4*d degrees, where d is measured in mm. The IQ imbalance due to separate antennas can be made less than the IQ imbalance floor of the transmitter by keeping the two antennas very close, thereby enabling successful receipt of the over-the-air combined I and Q signal.

Example components of a mobile wireless communications device 1000 that may be used in accordance with the above-described embodiments are further described below with reference to FIG. 14. The device 1000 illustratively includes a housing 1200, a keyboard or keypad 1400 and an output device 1600. The output device shown is a display 1600, which may comprise a full graphic liquid crystal display (LCD). Other types of output devices may alternatively be utilized. A processing device 1800 is contained within the housing 1200 and is coupled between the keypad 1400 and the display 1600. The processing device 1800 controls the operation of the display 1600, as well as the overall operation of the mobile device 1000, in response to actuation of keys on the keypad 1400.

The housing 1200 may be elongated vertically, or may take on other sizes and shapes (including clamshell housing structures). The keypad may include a mode selection key, or other hardware or software for switching between text entry and telephony entry.

Figure 14:
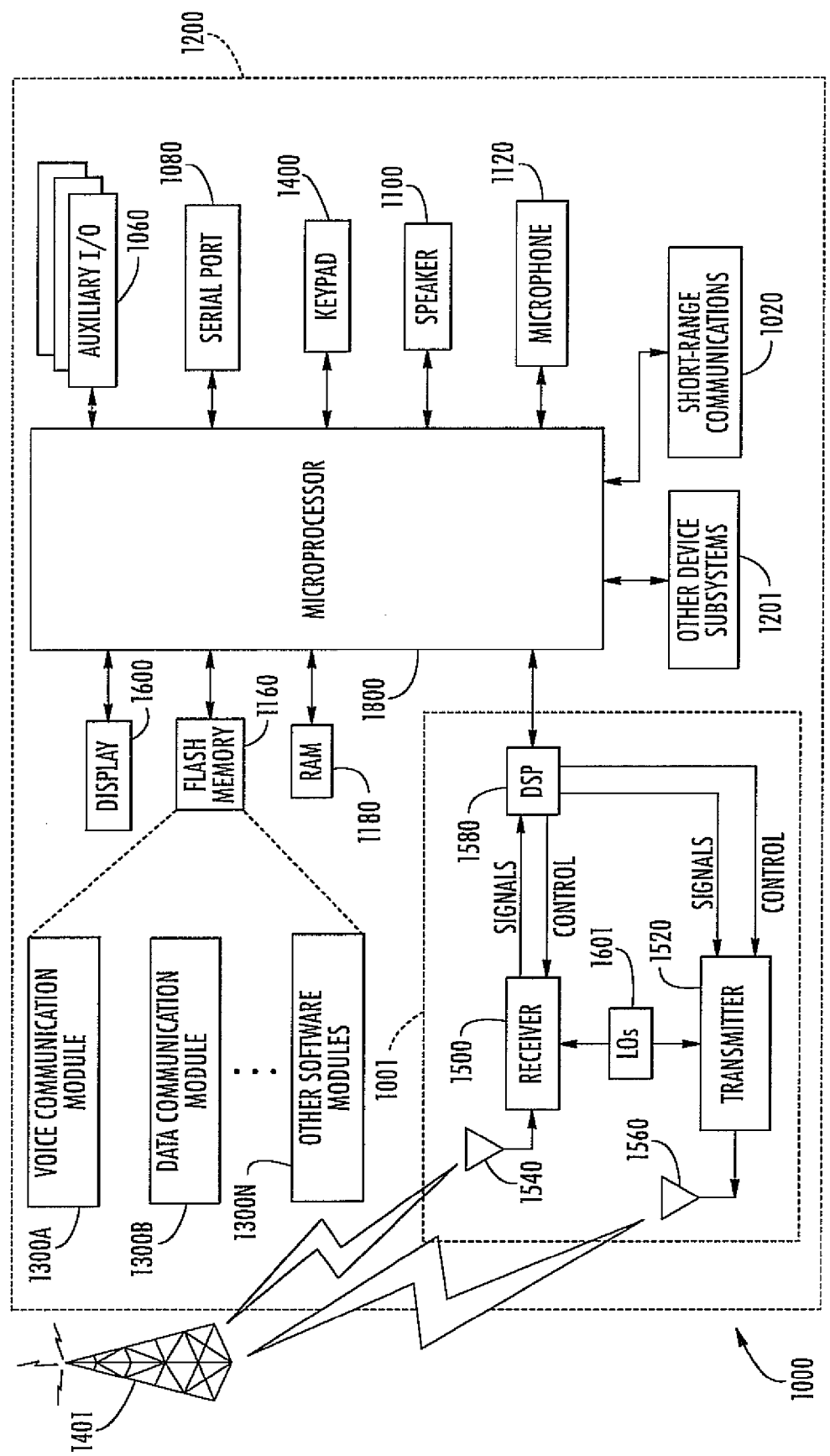
FIG. 14 is a schematic block diagram illustrating example components of a mobile wireless communications device that may be used with the communications devices of FIGS. 1-9.

In addition to the processing device 1800, other parts of the mobile device 1000 are shown schematically in FIG. 14. These include a communications subsystem 1001; a short-range communications subsystem 1020; the keypad 1400 and the display 1600, along with other input/output devices 1060, 1080, 1100 and 1120; as well as memory devices 1160, 1180 and various other device subsystems 1201. The mobile device 1000 may comprise a two-way RF communications device having data and, optionally, voice communications capabilities. In addition, the mobile device 1000 may have the capability to communicate with other computer systems via the Internet.

Operating system software executed by the processing device 1800 is stored in a persistent store, such as the flash memory 1160, but may be stored in other types of memory devices, such as a read only memory (ROM) or similar storage element. In addition, system software, specific device applications, or parts thereof, may be temporarily loaded into a volatile store, such as the random access memory (RAM) 1180. Communications signals received by the mobile device may also be stored in the RAM 1180.

The processing device 1800, in addition to its operating system functions, enables execution of software applications 1300A-1300N on the device 1000. A predetermined set of applications that control basic device operations, such as data and voice communications 1300A and 1300B, may be installed on the device 1000 during manufacture. In addition, a personal information manager (PIM) application may be installed during manufacture. The PIM may be capable of organizing and managing data items, such as e-mail, calendar events, voice mails, appointments, and task items. The PIM application may also be capable of sending and receiving data items via a wireless network 1401. The PIM data items may be seamlessly integrated, synchronized and updated via the wireless network 1401 with corresponding data items stored or associated with a host computer system.

Communication functions, including data and voice communications, are performed through the communications subsystem 1001, and possibly through the short-range communications subsystem 1020. The communications subsystem 1001 includes a receiver 1500, a transmitter 1520, and one or more antennas 1540 and 1560. In addition, the communications subsystem 1001 also includes a processing module, such as a digital signal processor (DSP) 1580, and local oscillators (LOs) 1601. The specific design and implementation of the communications subsystem 1001 is dependent upon the communications network in which the mobile device 1000 is intended to operate. For example, a mobile device 1000 may include a communications subsystem 1001 designed to operate with the Mobitex™, Data TAG™ or General Packet Radio Service (GPRS) mobile data communications networks, and also designed to operate with any of a variety of voice communications networks, such as Advanced Mobile Phone System (AMPS), time division multiple access (TDMA), code division multiple access (CDMA), Wideband code division multiple access (W-CDMA), personal communications service (PCS), GSM (Global System for Mobile Communications), enhanced data rates for GSM evolution (EDGE), etc. Other types of data and voice networks, both separate and integrated, may also be utilized with the mobile device 1000. The mobile device 1000 may also be compliant with other communications standards such as 3GSM, 3rd Generation Partnership Project (3GPP), Universal Mobile Telecommunications System (UMTS), 4G, etc.

Network access requirements vary depending upon the type of communication system. For example, in the Mobitex and DataTAC networks, mobile devices are registered on the network using a unique personal identification number or PIN associated with each device. In GPRS networks, however, network access is associated with a subscriber or user of a device. A GPRS device therefore typically involves use of a subscriber identity module, commonly referred to as a SIM card, in order to operate on a GPRS network.

When required network registration or activation procedures have been completed, the mobile device 1000 may send and receive communications signals over the communication network 1401. Signals received from the communications network 1401 by the antenna 1540 are routed to the receiver 1500, which provides for signal amplification, frequency down conversion, filtering, channel selection, etc., and may also provide analog to digital conversion. Analog-to-digital conversion of the received signal allows the DSP 1580 to perform more complex communications functions, such as demodulation and decoding. In a similar manner, signals to be transmitted to the network 1401 are processed (e.g. modulated and encoded) by the DSP 1580 and are then provided to the transmitter 1520 for digital to analog conversion, frequency up conversion, filtering, amplification and transmission to the communication network 1401 (or networks) via the antenna 1560.

In addition to processing communications signals, the DSP 1580 provides for control of the receiver 1500 and the transmitter 1520. For example, gains applied to communications signals in the receiver 1500 and transmitter 1520 may be adaptively controlled through automatic gain control algorithms implemented in the DSP 1580.

In a data communications mode, a received signal, such as a text message or web page download, is processed by the communications subsystem 1001 and is input to the processing device 1800. The received signal is then further processed by the processing device 1800 for an output to the display 1600, or alternatively to some other auxiliary I/O device 1060. A device may also be used to compose data items, such as e-mail messages, using the keypad 1400 and/or some other auxiliary I/O device 1060, such as a touchpad, a rocker switch, a thumb-wheel, or some other type of input device. The composed data items may then be transmitted over the communications network 1401 via the communications subsystem 1001.

In a voice communications mode, overall operation of the device is substantially similar to the data communications mode, except that received signals are output to a speaker 1100, and signals for transmission are generated by a microphone 1120. Alternative voice or audio I/O subsystems, such as a voice message recording subsystem, may also be implemented on the device 1000. In addition, the display 1600 may also be utilized in voice communications mode, for example to display the identity of a calling party, the duration of a voice call, or other voice call related information.

The short-range communications subsystem enables communication between the mobile device 1000 and other proximate systems or devices, which need not necessarily be similar devices. For example, the short-range communications subsystem may include an infrared device and associated circuits and components, a Bluetooth™ communications module to provide for communication with similarly-enabled systems and devices, or a NFC sensor for communicating with a NFC device or NFC tag via NFC communications.

Other features relating to communications devices are disclosed in co-pending application(s) "QUADRATURE COMMUNICATIONS DEVICE WITH I ANTENNAS AND Q ANTENNAS AND RELATED METHODS," Ser. No. 13/049,243; and "QUADRATURE COMMUNICATIONS DEVICE WITH POWER COMBINER AND RELATED METHODS," Ser. No. 13/049,272, all incorporated herein by reference in their entirety.

Many modifications and other embodiments will come to the mind of one skilled in the art having the benefit of the teachings presented in the foregoing descriptions and the associated drawings. Therefore, it is understood that various modifications and embodiments are intended to be included within the scope of the appended claims.

That which is claimed is:

1. A communications device comprising:
    an In-phase (I) power amplifier configured to generate an I amplified signal;
    a Quadrature (Q) power amplifier configured to generate a Q amplified signal;
    a programmable I driver coupled upstream of said I power amplifier;
    a programmable Q driver coupled upstream of said Q power amplifier;
    an I digital-to-analog converter (DAC) configured to generate an I signal;
    a Q DAC configured to generate a Q signal;
    an I power supply circuit coupled to said I power amplifier and to said I DAC and configured to cause said I power amplifier to modulate an I carrier signal into the I amplified signal based upon the I signal;
    a Q power supply circuit coupled to said Q power amplifier and to said Q DAC and configured to cause said Q power amplifier to modulate a Q carrier signal into the Q amplified signal based upon the Q signal; and
    at least one antenna coupled to said I and Q power amplifiers.

2. The communications device of claim 1 further comprising a power combiner coupled between said at least one antenna and said I and Q power amplifiers.

3. The communications device of claim 1 wherein said at least one antenna comprises a plurality thereof, said plurality of antennas comprising:
    an I antenna coupled to said I power amplifier; and
    a Q antenna coupled to said Q power amplifier.

4. The communications device of claim 3 wherein said I and Q antennas are physically separated.

5. The communications device of claim 1 wherein said I and Q power amplifiers are configured to operate in a saturated mode of operation.

6. The communications device of claim 1 further comprising an I look-up table (LUT) module upstream of said I DAC and configured to supply a linear I signal thereto, and a Q LUT module upstream of said Q DAC configured to supply a linear Q signal.

7. The communications device of claim 1 further comprising a phase locked loop (PLL) configured to generate the I and Q carrier signals.

8. The communications device of claim 7 wherein said PLL is configured to generate the I and Q carrier signals comprising constant envelop I and Q carrier signals.

9. The communications device of claim 8 further comprising at least one of a 90/270-degree phase shifter and a 0/180-degree phase shifter between said PLL and said programmable Q driver.

10. The communications device of claim 1 wherein said I and Q power supply circuits each comprises a respective switched mode power supply circuit.

11. The communications device of claim 3 wherein said I and Q antennas comprise rectangular-shaped strip antennas; and wherein said I and Q rectangular-shaped strip antennas are adjacent to each other.

12. The communications device of claim 1 wherein said I and Q DACs are operable using at least fourth generation cellular wireless signals.

13. A communications device comprising:
    an In-phase (I) power amplifier configured to generate an I amplified signal;
    a Quadrature (Q) power amplifier configured to generate a Q amplified signal;
    a programmable I driver coupled upstream of said I power amplifier;
    a programmable Q driver coupled upstream of said Q power amplifier;
    an I digital-to-analog converter (DAC) configured to generate an I signal;
    a Q DAC configured to generate a Q signal;
    a phase locked loop (PLL) configured to generate I and Q carrier signals;
    an I power supply circuit coupled to said I power amplifier and to said I DAC and configured to cause said I power amplifier to modulate the I carrier signal into the I amplified signal based upon the I signal;

a Q power supply circuit coupled to said Q power amplifier and to said Q DAC and configured to cause said Q power amplifier to modulate the Q carrier signal into the Q amplified signal based upon the Q signal;

an I antenna coupled to said I power amplifier; and a Q antenna coupled to said Q power amplifier and being physically separated from said I antenna.

14. The communications device of claim 13 wherein said I and Q power amplifiers are configured to operate in a saturated mode of operation.

15. The communications device of claim 13 further comprising an I look-up table (LUT) module upstream of said I DAC and configured to supply a linear I signal thereto, and a Q LUT module upstream of said Q DAC and configured to supply a linear Q signal thereto.

16. The communications device of claim 13 wherein said PLL is configured to generate the I and Q carrier signals comprising constant envelop I and Q carrier signals.

17. The communications device of claim 13 further comprising a 90/270-degree phase shifter between said PLL and said programmable Q driver.

18. A method of operating a communications device comprising:

using an In-phase (I) power amplifier and a programmable I driver coupled upstream of the I power amplifier to generate an I amplified signal;

using a Quadrature (Q) power amplifier and a programmable Q driver coupled upstream of the Q power amplifier to generate a Q amplified signal;

using an I digital-to-analog converter (DAC) to generate an I signal;

using a Q DAC to generate a Q signal;

using an I power supply circuit to cause the I power amplifier to modulate an I carrier signal into the I amplified signal based upon the I signal;

using a Q power supply circuit to cause the Q power amplifier to modulate a Q carrier signal into the Q amplified signal based upon the Q signal; and using at least one antenna to transmit the I and Q amplified signals.

19. The method of claim 18 further comprising using a power combiner coupled between the at least one antenna and the I and Q power amplifiers to combine the I and Q amplified signals.

20. The method of claim 18 further comprising using an I antenna coupled to the I power amplifier to transmit the amplified I signal; and using a Q antenna coupled to the Q power amplifier to transmit the amplified Q signal.

21. The method of claim 20 further comprising using physically separate I and Q antennas to respectively transmit the I and Q amplified signals.

22. The method of claim 18 further comprising using the I and Q power amplifiers to operate in a saturated mode of operation.

23. The method of claim 18 further comprising using a phase locked loop (PLL) to generate the I and Q carrier signals.

24. The method of claim 23 further comprising using the PLL to generate the I and Q carrier signals comprising constant envelop I and Q carrier signals.

25. The method of claim 18 further comprising using the I and Q DACs to be operable using at least fourth generation cellular wireless signals.

* * * * *